US006940761B2

(12) United States Patent
Forbes

(10) Patent No.: US 6,940,761 B2
(45) Date of Patent: Sep. 6, 2005

(54) MERGED MOS-BIPOLAR CAPACITOR MEMORY CELL

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/990,586

(22) Filed: Nov. 17, 2004

(65) Prior Publication Data

US 2005/0094453 A1 May 5, 2005

Related U.S. Application Data

(62) Division of application No. 10/230,929, filed on Aug. 29, 2002, now Pat. No. 6,838,723.

(51) Int. Cl.[7] ............................................ G11C 11/34
(52) U.S. Cl. ............................ 365/189.09; 365/185.01
(58) Field of Search .......................... 365/154, 185.01, 365/189.09

(56) References Cited

U.S. PATENT DOCUMENTS 4,826,780 A 5/1989 Takemoto et al.
4,970,689 A 11/1990 Kenney
4,999,811 A 3/1991 Banerjee
5,006,909 A 4/1991 Kosa
5,017,504 A 5/1991 Nishimura et al.
5,021,355 A 6/1991 Dhong et al.
5,042,011 A 8/1991 Casper et al.
5,066,607 A 11/1991 Banerjee
5,078,798 A 1/1992 Nicolson et al.
5,122,986 A 6/1992 Lim
5,220,530 A 6/1993 Itoh
5,280,205 A 1/1994 Green et al.
5,291,438 A 3/1994 Witek et al.
5,308,783 A 5/1994 Krautschneider et al.
5,329,481 A * 7/1994 Seevinck et al. ........... 365/177
5,378,914 A 1/1995 Ohzu et al.
5,381,302 A 1/1995 Sandhu et al.
5,385,853 A 1/1995 Mohammad
5,414,288 A 5/1995 Fitch et al.
5,448,513 A 9/1995 Hu et al.

(Continued)

FOREIGN PATENT DOCUMENTS

JP 61-140170 6/1986

(Continued)

OTHER PUBLICATIONS

U.S. Appl. No. 10/231,397, filed Aug. 29, 2002.

(Continued)

*Primary Examiner*—M. Tran
(74) *Attorney, Agent, or Firm*—Schwegman, Lundberg, Woessner & Kluth, P.A.

(57) ABSTRACT

A high density vertical merged MOS-bipolar-capacitor gain cell is realized for DRAM operation. The gain cell includes a vertical MOS transistor having a source region, a drain region, and a floating body region therebetween. The gain cell includes a vertical bi-polar transistor having an emitter region, a base region and a collector region. The base region for the vertical bi-polar transistor serves as the source region for the vertical MOS transistor. A gate opposes the floating body region and is separated therefrom by a gate oxide on a first side of the vertical MOS transistor. A floating body back gate opposes the floating body region on a second side of the vertical transistor. The base region for the vertical bi-polar transistor is coupled to a write data word line.

27 Claims, 10 Drawing Sheets

U.S. PATENT DOCUMENTS

| | | | | |
|---|---|---|---|---|
| 5,478,772 | A | 12/1995 | Fazan | |
| 5,506,166 | A | 4/1996 | Sandhu et al. | |
| 5,519,236 | A | 5/1996 | Ozaki | |
| 5,574,299 | A | 11/1996 | Kim | |
| 5,627,785 | A | 5/1997 | Gilliam et al. | |
| 5,707,885 | A | 1/1998 | Lim | |
| 5,719,409 | A | 2/1998 | Singh et al. | |
| 5,732,014 | A | 3/1998 | Forbes | |
| 5,793,686 | A * | 8/1998 | Furutani et al. | 365/201 |
| 5,854,500 | A | 12/1998 | Krautschneider | |
| 5,897,351 | A | 4/1999 | Forbes | |
| 5,909,618 | A | 6/1999 | Forbes et al. | |
| 5,936,274 | A | 8/1999 | Forbes et al. | |
| 5,937,296 | A | 8/1999 | Arnold | |
| 5,959,327 | A | 9/1999 | Sandhu et al. | |
| 5,966,319 | A * | 10/1999 | Sato | 365/154 |
| 5,973,356 | A | 10/1999 | Noble et al. | |
| 5,991,225 | A | 11/1999 | Forbes et al. | |
| 5,999,455 | A | 12/1999 | Lin et al. | |
| 6,030,847 | A | 2/2000 | Fazan et al. | |
| 6,031,263 | A | 2/2000 | Forbes et al. | |
| 6,072,209 | A | 6/2000 | Noble et al. | |
| 6,077,745 | A | 6/2000 | Burns, Jr. et al. | |
| 6,097,065 | A | 8/2000 | Forbes et al. | |
| 6,104,061 | A | 8/2000 | Forbes et al. | |
| 6,111,286 | A * | 8/2000 | Chi et al. | 257/315 |
| 6,124,729 | A | 9/2000 | Noble et al. | |
| 6,143,636 | A | 11/2000 | Forbes et al. | |
| 6,150,687 | A | 11/2000 | Noble et al. | |
| 6,153,468 | A | 11/2000 | Forbes et al. | |
| 6,172,390 | B1 | 1/2001 | Rupp et al. | |
| 6,191,448 | B1 | 2/2001 | Forbes et al. | |
| 6,204,115 | B1 | 3/2001 | Cho | |
| 6,238,976 | B1 | 5/2001 | Noble et al. | |
| 6,246,083 | B1 | 6/2001 | Noble | |
| 6,249,020 | B1 | 6/2001 | Forbes et al. | |
| 6,249,460 | B1 | 6/2001 | Forbes et al. | |
| 6,282,115 | B1 | 8/2001 | Furukawa et al. | |
| 6,307,775 | B1 | 10/2001 | Forbes et al. | |
| 6,316,309 | B1 | 11/2001 | Holmes et al. | |
| 6,350,635 | B1 | 2/2002 | Noble et al. | |
| 6,384,448 | B1 | 5/2002 | Forbes | |
| 6,399,979 | B1 | 6/2002 | Noble et al. | |
| 6,440,801 | B1 | 8/2002 | Furukawa et al. | |
| 6,456,535 | B2 | 9/2002 | Forbes et al. | |
| 6,492,233 | B2 | 12/2002 | Forbes et al. | |
| 6,501,116 | B2 | 12/2002 | Kisu et al. | |
| 6,504,201 | B1 | 1/2003 | Noble et al. | |
| 6,531,730 | B2 | 3/2003 | Sandhu et al. | |
| 6,538,916 | B2 | 3/2003 | Ohsawa | |
| 6,566,682 | B2 | 5/2003 | Forbes | |
| 6,624,033 | B2 | 9/2003 | Noble | |
| 6,680,864 | B2 | 1/2004 | Noble | |
| 6,710,465 | B2 | 3/2004 | Song et al. | |
| 6,727,141 | B1 | 4/2004 | Bronner et al. | |
| 2001/0028078 | A1 | 10/2001 | Noble | |
| 2001/0030338 | A1 | 10/2001 | Noble | |
| 2001/0032997 | A1 | 10/2001 | Forbes et al. | |
| 2001/0053096 | A1 | 12/2001 | Forbes et al. | |
| 2002/0098639 | A1 | 7/2002 | Kisu et al. | |
| 2002/0126536 | A1 | 9/2002 | Forbes et al. | |
| 2003/0001191 | A1 | 1/2003 | Forbes et al. | |
| 2003/0129001 | A1 | 7/2003 | Kisu et al. | |
| 2003/0155604 | A1 | 8/2003 | Sandhu et al. | |
| 2003/0205754 | A1 | 11/2003 | Forbes et al. | |
| 2004/0041236 | A1 | 3/2004 | Forbes | |

FOREIGN PATENT DOCUMENTS

| | | |
|---|---|---|
| JP | 5226661 | 9/1993 |

OTHER PUBLICATIONS

U.S. Appl. No. 10/230,292, filed Aug. 29, 2002.
U.S. Appl. No. 10/309,873, filed Dec. 4, 2002.
U.S. Appl. No. 10/292,080, filed Nov. 12, 2002.
U.S. Appl. No. 10/379,478, filed Mar. 4, 2003.
U.S. Appl. No. 10/909,480, filed Aug. 2, 2004.
U.S. Appl. No. 10/929,307, filed Aug. 30, 2004.
U.S. Appl. No. 10/931,573, filed Aug. 31, 2004.
U.S. Appl. No. 10/931,545, filed Aug. 31, 2004.

Adler, E., et al., "The Evolution of IBM CMOS DRAM Technology", *IBM Journal of Research & Development, 39*(*1-2*), (Jan.-Mar. 1995), 167-188.

Blalock, T. N., et al., "An Experimental 2T Cell RAM with 7 NS Access Time at Low Temperature", *1990 Symposium on VLSI Circuits. Digest of Technical Papers*, (1990), 13-14.

Kim, Wonchan, "A low-voltage multi-bit DRAM cell with a built-in gain stage", *ESSCIRC 93. Nineteenth European Solid-State Circuits Conference. Proceedings*, (1993), 37-40.

Kim, W., et al., "An Experimental High-Density DRAM Cell with a Built-in Gain Stage", *IEEE Journal of Solid-State Circuits, 29*(*8*), (Aug. 1994), 978-981.

Krautschneider, W H., et al., "Fully scalable gain memory cell for future DRAMs", *Microelectronic Engineering, 15* (*1-4*), (Oct. 1991), 367-70.

Krautschneider, F., "Planar Gain Cell for Low Voltage Operation and Gigabit Memories", *Symposium on VLSI Technology Digest of Technical Papers*, (1995), 139-140.

Mukai, M., et al., "A novel merged gain cell for logic compatible high density DRAMs", *1997 Symposium on VLSI Technology, Digest of Technical Papers*, (Jun. 10-12, 1997), 155-156.

Mukai, M, et al., "Proposal of a Logic Compatible Merged-Type Gain Cell for High Density Embedded . . . ", *IEEE Transactions on Electron Devices*, (Jun. 1999), 1201-1206.

Ohsawa, T, "Memory design using one-transistor gain cell on SOI", *IEEE International Solid-State Circuits Conference. Digest of Technical Papers*, vol. 1, (2002), 152-455.

Okhonin, S, "A SOI capacitor-less 1T-DRAM concept", *2001 IEEE International SOI Conference. Proceedings, IEEE. 2001*, (2000), 153-4.

Rabaey, Jan M., "Digital integrated circuits: a design perspective", *Upper Saddle River, N.J. : Prentice Hall*, (1996), 585-590.

Shukuri, S, "A complementary gain cell technology for sub-1 V supply DRAMs", *Electron Devices Meeting 1992. Technical Digest*, (1992), 1006-1009.

Shukuri, S., "A Semi-Static Complementary Gain Cell Technology for Sub-1 V Supply DRAMs", *IEEE Transactions on Electron Devices, 41*(*6*), (Jun. 1994), 926-931.

Shukuri, S., "Super-Low Voltage Operation of a Semi-Static Complemenatry Gain DRAM Memory Cell", *Symposium on VLSI Technology, Digest of Technical Papers*, (1993), 23-24.

Sunouchi, K, et al., "A self-amplifying (SEA) cell for future high density DRAMs", *International Electron Devices Meeting 1991. Technical Digest*, (1991), 465-8.

Takato, H., et al., "Process Integration Trends for Embedded DRAM", *ULSI Process Integration. Proceedings of the First Interational Symposium* (*Electrochemical Society Proceedings* vol. 99-18, (1999), 107-19.

Terauchi, M., "A Surrounding Gate Transistor (SGT) Gain Cell for Ultra High Density DRAMs", *1993 Symposium on VLSI Technology, Digest of Technical Papers*, Kyoto, Japan, (1993), 21-22.

Wann, Hsing-Jen, et al., "A Capacitorless DRAM Cell SOI Substrate", *International Electron Devices Meeting 1993. Technical Digest*, (Dec. 5-8, 1993), 635-638.

* cited by examiner

MERGED MOS-BIPOLAR CAPACITOR MEMORY CELL

CROSS REFERENCE TO RELATED APPLICATIONS

The present application is a divisional of U.S. patent application Ser. No. 10/230,929, filed Aug. 29, 2002 now U.S. Pat. No. 6,838,723, which is incorporated herein by reference.

This application is related to the following co-pending, commonly assigned U.S. patent application: "Single Transistor Vertical Memory Gain Cell," Ser. No. 10/231,397, filed on Aug. 29, 2002, and which is herein incorporated by reference.

FIELD OF THE INVENTION

The present invention relates generally to integrated circuits, and in particular to a merged MOS-bipolar capacitor memory cell.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 140 and an access field effect transistor or transfer device 120. For each cell, one side of the storage capacitor 140 is connected to a reference voltage (illustrated as a ground potential for convenience purposes). The other side of the storage capacitor 140 is connected to the drain of the transfer device 120. The gate of the transfer device 120 is connected to a signal known in the art as a word line 180. The source of the transfer device 120 is connected to a signal known in the art as a bit line 160 (also known in the art as a digit line). With the memory cell 100 components connected in this manner, it is apparent that the word line 180 controls access to the storage capacitor 140 by allowing or preventing the signal (representing a logic "0" or a logic "1") carried on the bit line 160 to be written to or read from the storage capacitor 140. Thus, each cell 100 contains one bit of data (i.e., a logic "0" or logic "1").

In FIG. 2 a DRAM circuit 240 is illustrated. The DRAM 240 contains a memory array 242, row and column decoders 244, 248 and a sense amplifier circuit 246. The memory array 242 consists of a plurality of memory cells 200 (constructed as illustrated in FIG. 1) whose word lines 280 and bit lines 260 are commonly arranged into rows and columns, respectively. The bit lines 260 of the memory array 242 are connected to the sense amplifier circuit 246, while its word lines 280 are connected to the row decoder 244. Address and control signals are input on address/control lines 261 into the DRAM 240 and connected to the column decoder 248, sense amplifier circuit 246 and row decoder 244 and are used to gain read and write access, among other things, to the memory array 242.

The column decoder 248 is connected to the sense amplifier circuit 246 via control and column select signals on column select lines 262. The sense amplifier circuit 246 receives input data destined for the memory array 242 and outputs data read from the memory array 242 over input/output (I/O) data lines 263. Data is read from the cells of the memory array 242 by activating a word line 280 (via the row decoder 244), which couples all of the memory cells corresponding to that word line to respective bit lines 260, which define the columns of the array. One or more bit lines 260 are also activated. When a particular word line 280 and bit lines 260 are activated, the sense amplifier circuit 246 connected to a bit line column detects and amplifies the data bit transferred from the storage capacitor of the memory cell to its bit line 260 by measuring the potential difference between the activated bit line 260 and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

The memory cells of dynamic random access memories (DRAMs) are comprised of two main components, a field-effect transistor (FET) and a capacitor which functions as a storage element. The need to increase the storage capability of semiconductor memory devices has led to the development of very large scale integrated (VLSI) cells which provides a substantial increase in component density. As component density has increased, cell capacitance has had to be decreased because of the need to maintain isolation between adjacent devices in the memory array. However, reduction in memory cell capacitance reduces the electrical signal output from the memory cells, making detection of the memory cell output signal more difficult. Thus, as the density of DRAM devices increases, it becomes more and more difficult to obtain reasonable storage capacity.

As DRAM devices are projected as operating in the gigabit range, the ability to form such a large number of storage capacitors requires smaller areas. However, this conflicts with the requirement for larger capacitance because capacitance is proportional to area. Moreover, the trend for reduction in power supply voltages results in stored charge reduction and leads to degradation of immunity to alpha particle induced soft errors, both of which require that the storage capacitance be even larger.

In order to meet the high density requirements of VLSI cells in DRAM cells, some manufacturers are utilizing DRAM memory cell designs based on non-planar capacitor structures, such as complicated stacked capacitor structures and deep trench capacitor structures. Although non-planar capacitor structures provide increased cell capacitance, such arrangements create other problems that affect performance of the memory cell. For example, trench capacitors are fabricated in trenches formed in the semiconductor substrate, the problem of trench-to-trench charge leakage caused by the parasitic transistor effect between adjacent trenches is enhanced. Moreover, the alpha-particle component of normal background radiation can generate hole-electron pairs in the silicon substrate which functions as one of the storage plates of the trench capacitor. This phenomenon will cause a charge stored within the affected cell capacitor to rapidly dissipate, resulting in a soft error.

Another approach has been to provide DRAM cells having a dynamic gain. These memory cells are commonly referred to as gain cells. For example, U.S. Pat. No. 5,220,530 discloses a two-transistor gain-type dynamic random access memory cell. The memory cell includes two field-effect transistors, one of the transistors functioning as write transistor and the other transistor functioning as a data storage transistor. The storage transistor is capacitively coupled via an insulating layer to the word line to receive substrate biasing by capacitive coupling from the read word line. This gain cell arrangement requires a word line, a bit or data line, and a separate power supply line which is a disadvantage, particularly in high density memory structures.

The inventor has previously disclosed a DRAM gain cell using two transistors. (See generally, L. Forbes, "Merged Transistor Structure for Gain Memory Cell," U.S. Pat. No. 5,732,014, issued 24 Mar. 1998, continuation granted as 5,897,351, issued 27 Apr. 1999). A number of other gain cells have also been disclosed. (See generally, Sunouchi et al., "A self-Amplifying (SEA) Cell for Future High Density DRAMs," Ext. Abstracts of IEEE Int. Electron Device Meeting, pp. 465–468 (1991); M. Terauchi et al., "A Surrounding Gate Transistor (SGT) Gain Cell for Ultra High Density DRAMS," VLSI Tech. Symposium, pp. 21–22 (1993); S. Shukuri et al., "Super-Low-Voltage Operation of a Semi-Static Complementary Gain RAM Memory Cell," VLSI Tech. Symposium pp. 23–24 (1993); S. Shukuri et al., "A Complementary Gain Cell Technology for Sub-1V Supply DRAMs," Ext. Abs. of IEEE Int. Electron Device Meeting, pp. 1006–1009 (1992); S. Shukuri et al., "A Semi-Static Complementary Gain Cell Technology for Sub-1 V Supply DRAM's," IEEE Trans. on Electron Devices, Vol. 41, pp. 926–931 (1994); H. Wann and C. Hu, "A Capacitorless DRAM Cell on SOI Substrate," Ext. Abs. IEEE Int. Electron Devices Meeting, pp. 635–638; W. Kim et al., "An Experimental High-Density DRAM Cell with a Built-in Gain Stage," IEEE J. of Solid-State Circuits, Vol. 29, pp. 978–981 (1994); W. H. Krautschneider et al., "Planar Gain Cell for Low Voltage Operation and Gigabit Memories," Proc. VLSI Technology Symposium, pp. 139–140 (1995); D. M. Kenney, "Charge Amplifying trench Memory Cell," U.S. Pat. No. 4,970,689, 13 Nov. 1990; M. Itoh, "Semiconductor memory element and method of fabricating the same," U.S. Pat. No. 5,220,530, 15 Jun. 1993; W. H. Krautschneider et al., "Process for the Manufacture of a high density Cell Array of Gain Memory Cells," U.S. Pat. No. 5,308,783, 3 May 1994; C. Hu et al., "Capacitorless DRAM device on Silicon on Insulator Substrate," U.S. Pat. No. 5,448,513, 5 Sep. 1995; S. K. Banerjee, "Method of making a Trench DRAM cell with Dynamic Gain," U.S. Pat. No. 5,066,607, 19 Nov. 1991; S. K. Banerjee, "Trench DRAM cell with Dynamic Gain," U.S. Pat. No. 4,999,811, 12 Mar. 1991; Lim et al., "Two transistor DRAM cell," U.S. Pat. No. 5,122,986, 16 Jun. 1992).

Recently a one transistor gain cell has been reported as shown in FIG. 3. (See generally, T. Ohsawa et al., "Memory design using one transistor gain cell on SOI," IEEE Int. Solid State Circuits Conference, San Francisco, 2002, pp. 152–153). FIG. 3 illustrates a portion of a DRAM memory circuit containing two neighboring gain cells, 301 and 303. Each gain cell, 301 and 303, is separated from a substrate 305 by a buried oxide layer 307. The gain cells, 301 and 303, are formed on the buried oxide 307 and thus have a floating body, 309-1 and 309-2 respectively, separating a source region 311 (shared for the two cells) and a drain region 313-1 and 313-2. A bit/data line 315 is coupled to the drain regions 313-1 and 313-2 via bit contacts, 317-1 and 317-2. A ground source 319 is coupled to the source region 311. Wordlines or gates, 321-1 and 321-2, oppose the floating body regions 309-1 and 309-2 and are separated therefrom by a gate oxide, 323-1 and 323-2.

In the gain cell shown in FIG. 3 a floating body, 309-1 and 309-2, back gate bias is used to modulate the threshold voltage and consequently the conductivity of the NMOS transistor in each gain cell. The potential of the back gate body, 309-1 and 309-2, is made more positive by avalanche breakdown in the drain regions, 313-1 and 313-2, and collection of the holes generated by the body, 309-1 and 309-2. A more positive potential or forward bias applied to the body, 309-1 and 309-2, decreases the threshold voltage and makes the transistor more conductive when addressed. Charge storage is accomplished by this additional charge stored on the floating body, 309-1 and 309-2. Reset is accomplished by forward biasing the drain-body n-p junction diode to remove charge from the body.

Still, there is a need in the art for a memory cell structure for dynamic random access memory devices, which produces a large amplitude output signal without significantly increasing the size of the memory cell to improve memory densities.

SUMMARY OF THE INVENTION

The above mentioned problems with conventional memories and other problems are addressed by the present invention and will be understood by reading and studying the following specification. A high density vertical merged MOS-bipolar capacitor gain cell is realized for DRAM operation.

In one embodiment of the present invention, a high density vertical merged MOS-bipolar-capacitor gain cell is realized for DRAM operation. The gain cell includes a vertical MOS transistor having a source region, a drain region, and a floating body region therebetween. The gain cell includes a vertical bi-polar transistor having an emitter region, a base region and a collector region. The base region for the vertical bi-polar transistor serves as the source region for the vertical MOS transistor. A gate opposes the floating body region and is separated therefrom by a gate oxide on a first side of the vertical MOS transistor. A floating body back gate opposes the floating body region on a second side of the vertical transistor. The base region for the vertical bi-polar transistor is coupled to a write data word line. The emitter region for the vertical bi-polar transistor is coupled to an emitter line. The gate is coupled to a read data word line.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which are shown, by way of illustration, specific embodiments in which the invention may be practiced.

The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
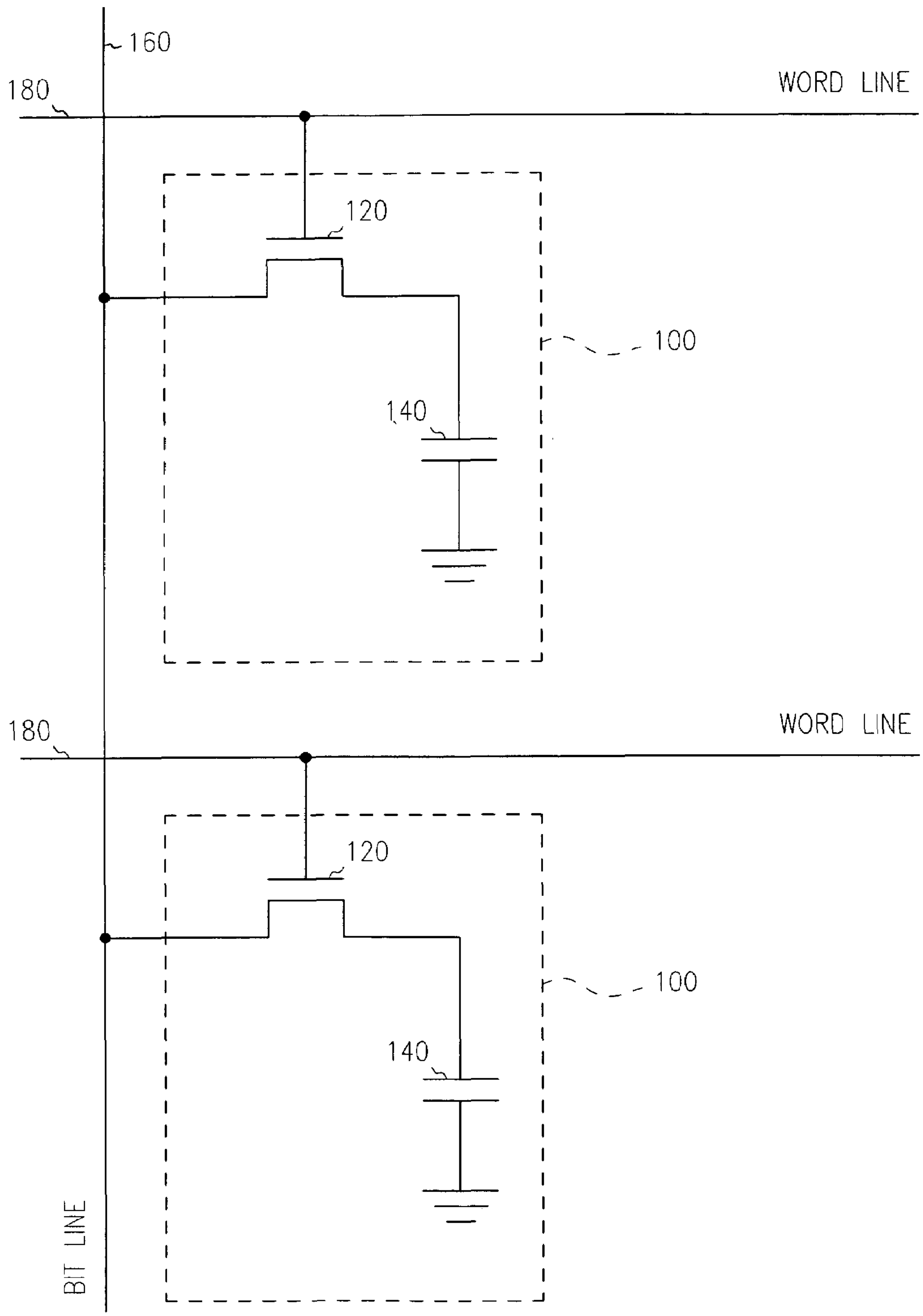
FIG. 1 is a circuit diagram illustrating conventional dynamic random access memory (DRAM) cells.
Figure 2:
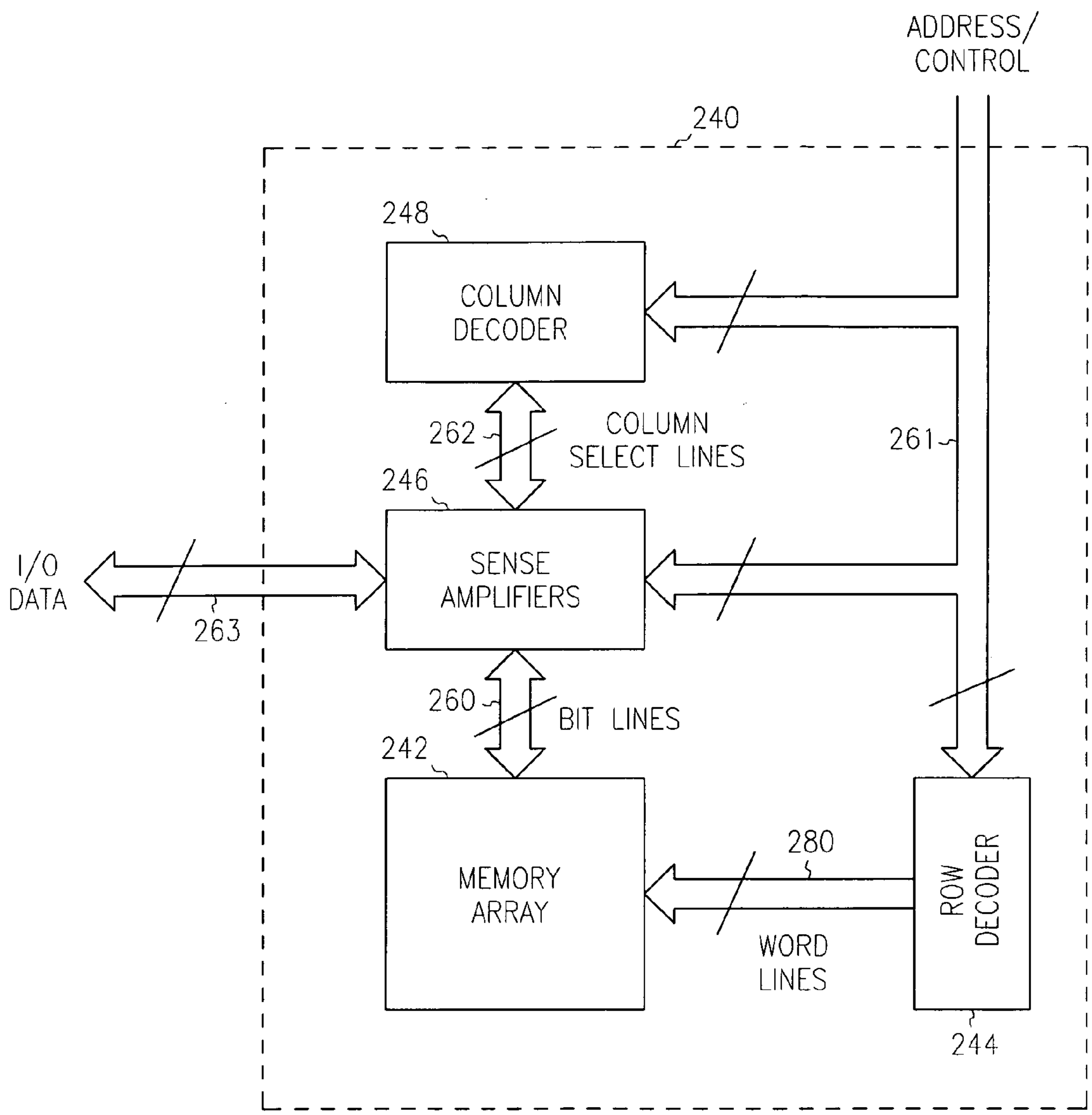
FIG. 2 is a block diagram illustrating a DRAM device.
Figure 3:
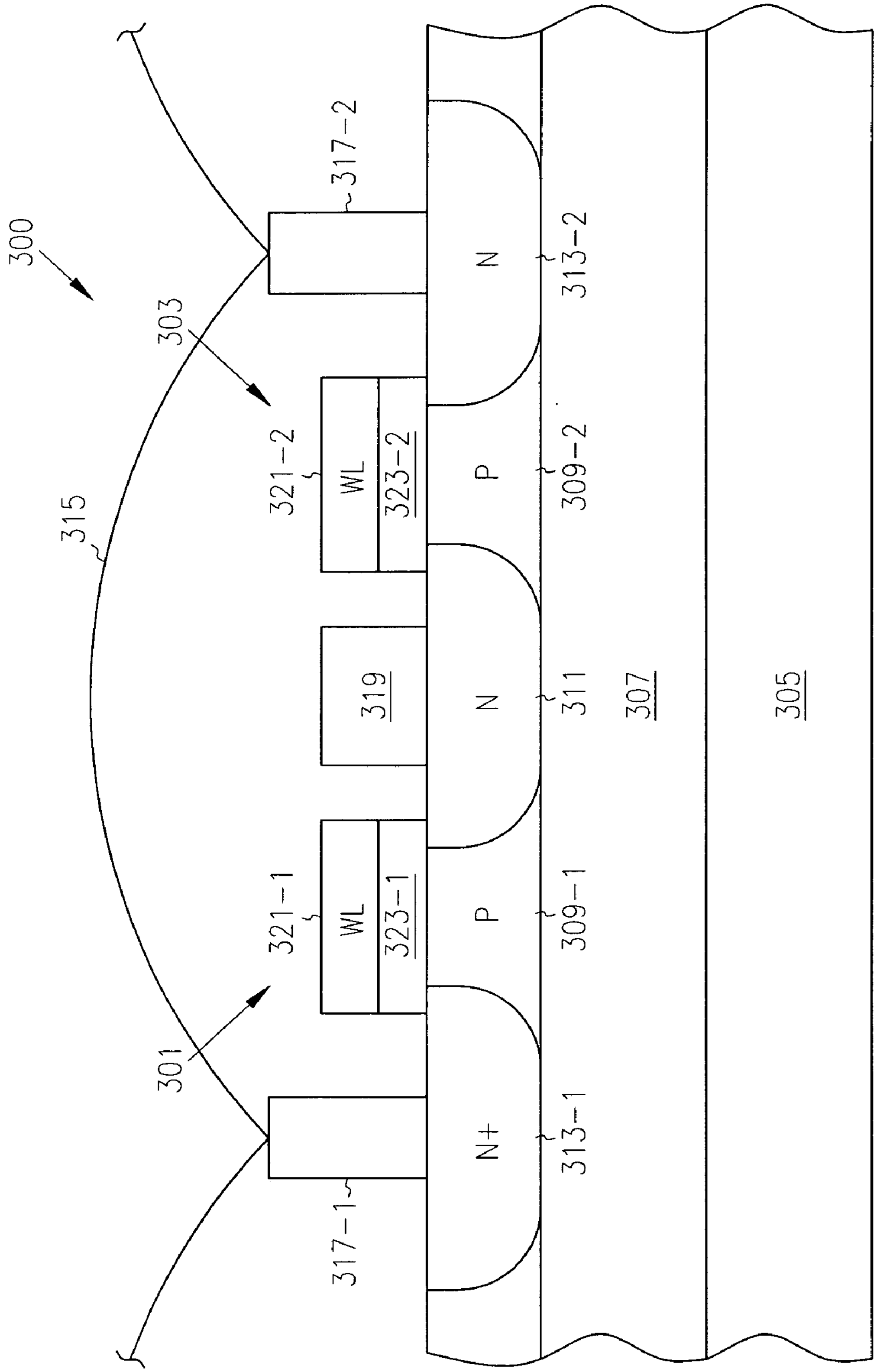
FIG. 3 illustrates a portion of a DRAM memory circuit containing two neighboring gain cells.
Figure 4A:
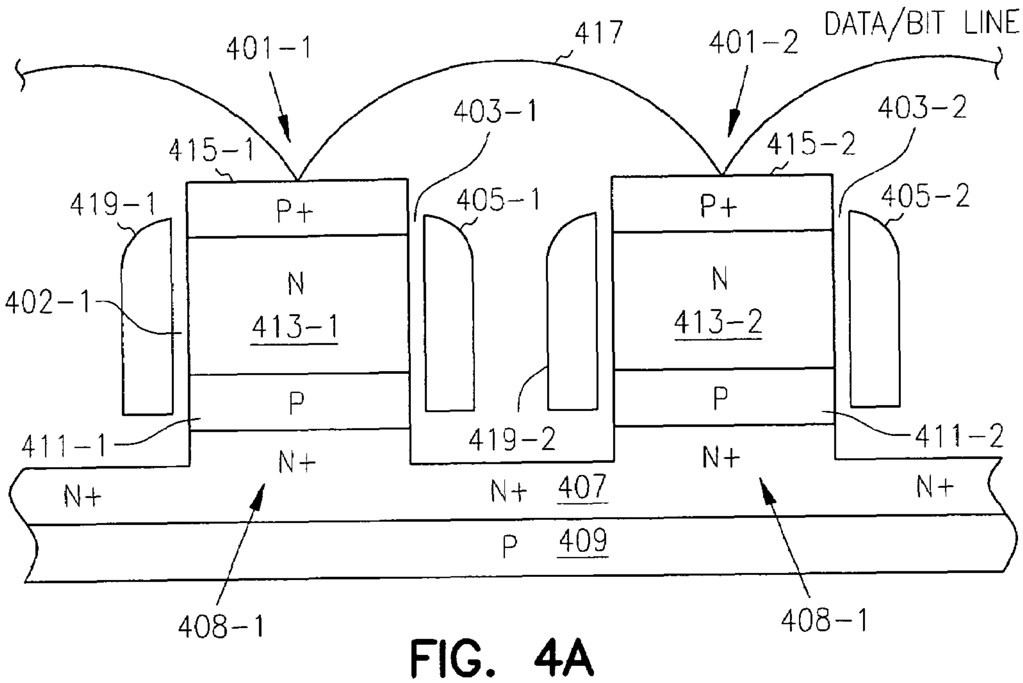
FIG. 4A is a cross-sectional view illustrating an embodiment of a pair of merged MO S-bipolar capacitor gain cells according to the teachings of the present invention.

FIG. 4A is a cross-sectional view illustrating an embodiment of a pair of memory cells, or merged MOS-bipolar capacitor gain cells, 401-1 and 401-2, according to the teachings of the present invention. The embodiment of the merged MOS-bipolar capacitor gain cells, 401-1 and 401-2, in FIG. 4A differs from that shown in FIG. 3 in that the transistors are vertical. Further, the memory cells, 401-1 and 401-2, of the present invention differ from those described in the above referenced copending, commonly assigned application, entitled "Single Transistor Vertical Memory Gain Cell," Ser. No. 10/231,397, in that here rather than avalanche breakdown being utilized to store charge on the floating body of a MOS transistor, charge is injected on to the body by bipolar transistor action.

As shown in embodiment of FIG. 4A, each merged MOS-bipolar capacitor gain cell, 401-1 and 401-2, along a row of an array is formed on an n+ conductivity type emitter line 407 formed on a p-type substrate 409. The vertically merged MOS-bipolar capacitor gain cells 401-1 and 401-2 include an n+ emitter region for the merged MOS-bipolar structure, 408-1 and 408-2 respectively. In some embodiments, as shown in FIG. 4A, the n+ emitter region, 408-1 and 408-2, is integrally formed with the emitter line 407. In the embodiment of FIG. 4A a p-type conductivity material, 411-1 and 411-2, is formed vertically on the n+ emitter region, 408-1 and 408-2. According to the teachings of the present invention the p-type conductivity material, 411-1 and 411-2, serves a dual role. That is, the p-type conductivity material, 411-1 and 411-2, serves as a base region for the bipolar device and a source region of the MOS device for the merged MOS-bipolar structure. In this manner, the base region of the bipolar device and the source region of the MOS device are electrically coupled to one another. The p-type conductivity material, 411-1 and 411-2, includes a connection (not shown) to a "write data word line" along columns in the array. The "write data word line" is operable to bias the base region function of the bipolar device of the merged MOS-bipolar structure.

In the embodiment of FIG. 4A, an n-type conductivity material, 413-1 and 413-2, is formed vertically on the p-type conductivity material, 411-1 and 411-2. According to the teachings of the present invention, the n-type conductivity material, 413-1 and 413-2, serves a dual role. That is, the n-type conductivity material, 413-1 and 413-2, serves as a collector region for the bipolar device and a body region of the MOS device for the merged MOS-bipolar structure. In this manner, the collector region of the bipolar device and the body region of the MOS device are electrically coupled to one another.

In the embodiment of FIG. 4A, a p+ type conductivity material, 415-1 and 415-2, is formed vertically on the n-type conductivity material, 413-1 and 413-2. The n-type conductivity material, 413-1 and 413-2, serves as the drain regions for the MOS device of the merged MOS-bipolar structure. A data/bit line 417 couples to the drain regions, 415-1 and 415-2, along rows of an array.

A body capacitor, 403-1 and 403-2, and body capacitor plate, 405-1 and 405-2, oppose the collector/body region 413-1 and 413-2 on one side of the vertical merged MOS-bipolar capacitor memory gain cells, 401-1 and 401-2. A gate, 419-1 and 419-2, is formed on another side of the vertical merged MOS-bipolar capacitor memory gain cells, 401-1 and 401-2 from the body capacitor, 403-1 and 403-2, and body capacitor plate, 405-1 and 405-2.

Figure 4B:
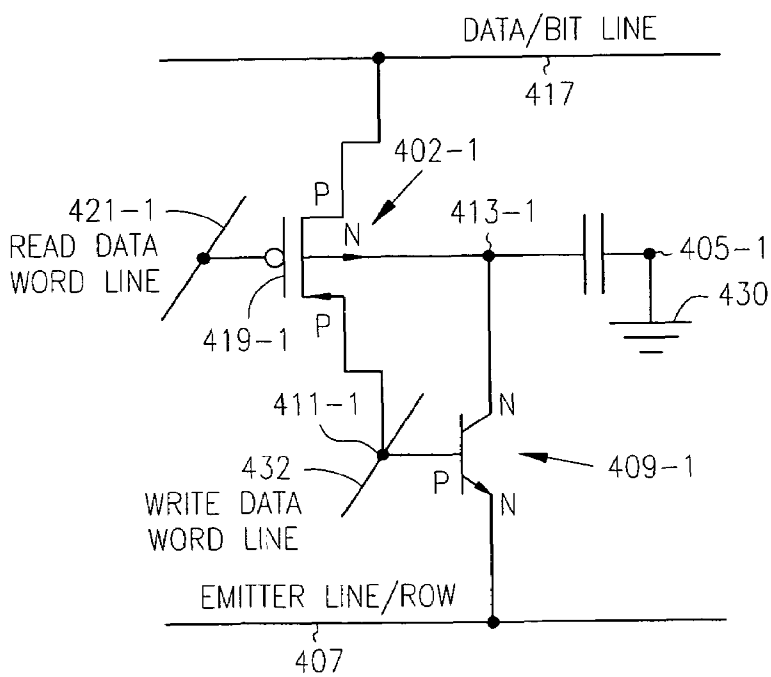
FIG. 4B illustrates an electrical equivalent circuit of one of the pair of merged MOS-bipolar capacitor gain cells shown in FIG. 4A.

FIG. 4B illustrates an electrical equivalent circuit for one of the pair of memory cells, or merged MOS-bipolar capacitor gain cells, 401-1 and 401-2, shown in FIG. 4A. In FIG. 4B, "read data word line" 421-1 is shown connected to gate 419-1.

Thus, as shown in FIGS. 4A and 4B, the merged device consists of a MOS transistor-bipolar transistor-storage capacitor. The sense device used to read the cell, e.g. cell 401-1, is the PMOS transistor, e.g. 402-1, which is addressed by the read data word line 421-1.

In operation, if negative charge or electrons are stored on the body 413-1, then the body will be slightly forward biased and the PMOS transistor 402-1 will be more conductive than normal. Charge is injected on to the floating body 413-1 of the PMOS transistor 402-1 by the N+-P-N vertical bipolar transistor, e.g. 409-1. The NPN transistor 409-1 need not be a high performance device nor have a high current gain. In the various embodiments, the NPN transistor 409-1 can be a basic, high yield structure. Forward bias can be achieved by driving the emitter/sourceline 407 negative and by driving the write data word line 432, connected to the base/source region 411-1, positive to achieve a coincident address at one location. This is illustrated in more detail in the schematic embodiment shown in FIG. 4D. The cell, 401-1, can be erased by driving the drain 415-1 positive and by driving the gate 419-1 negative to forward bias the drain-body p-n junction.

Figure 4C:
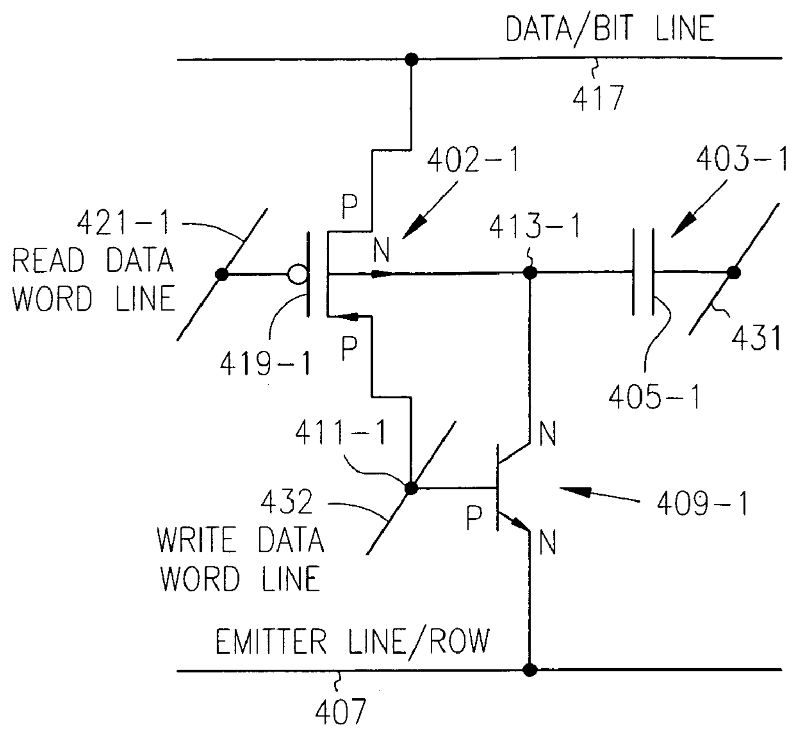
FIG. 4C illustrates an embodiment for one mode of operation according to the teachings of the present invention.
Figure 4D:
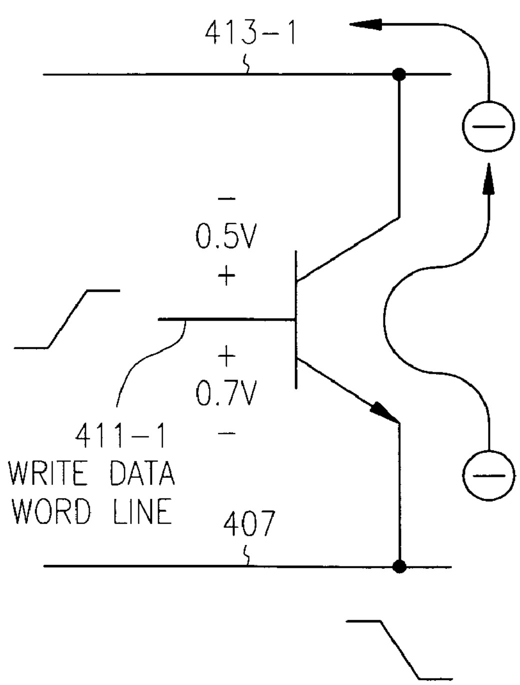
FIG. 4D illustrates an embodiment for a mode of operation of a vertical bi-polar transistor in a merged device according to the teachings of the present invention.

FIG. 4C illustrates an embodiment for another mode of operation for a vertical merged MOS-bipolar-capacitor memory gain cell, e.g. 401-1, according to the teachings of the present invention. In the mode of operation, shown in FIG. 4C, the embodiment allows provisions for biasing a body capacitor plate line 431 to a positive potential. In this embodiment, biasing a body capacitor plate line 431 can be used in conjunction with a positive read data word line 419-1 voltage to drive the n-type body 413-1 and the p-type source and drain, 411-1 and 415-1 respectively, junctions to a larger reverse bias during standby. This insures that the floating body 413-1 will not become forward biased during standby. Thus, stored charge will not be lost due to leakage currents with forward bias.

Figure 5:
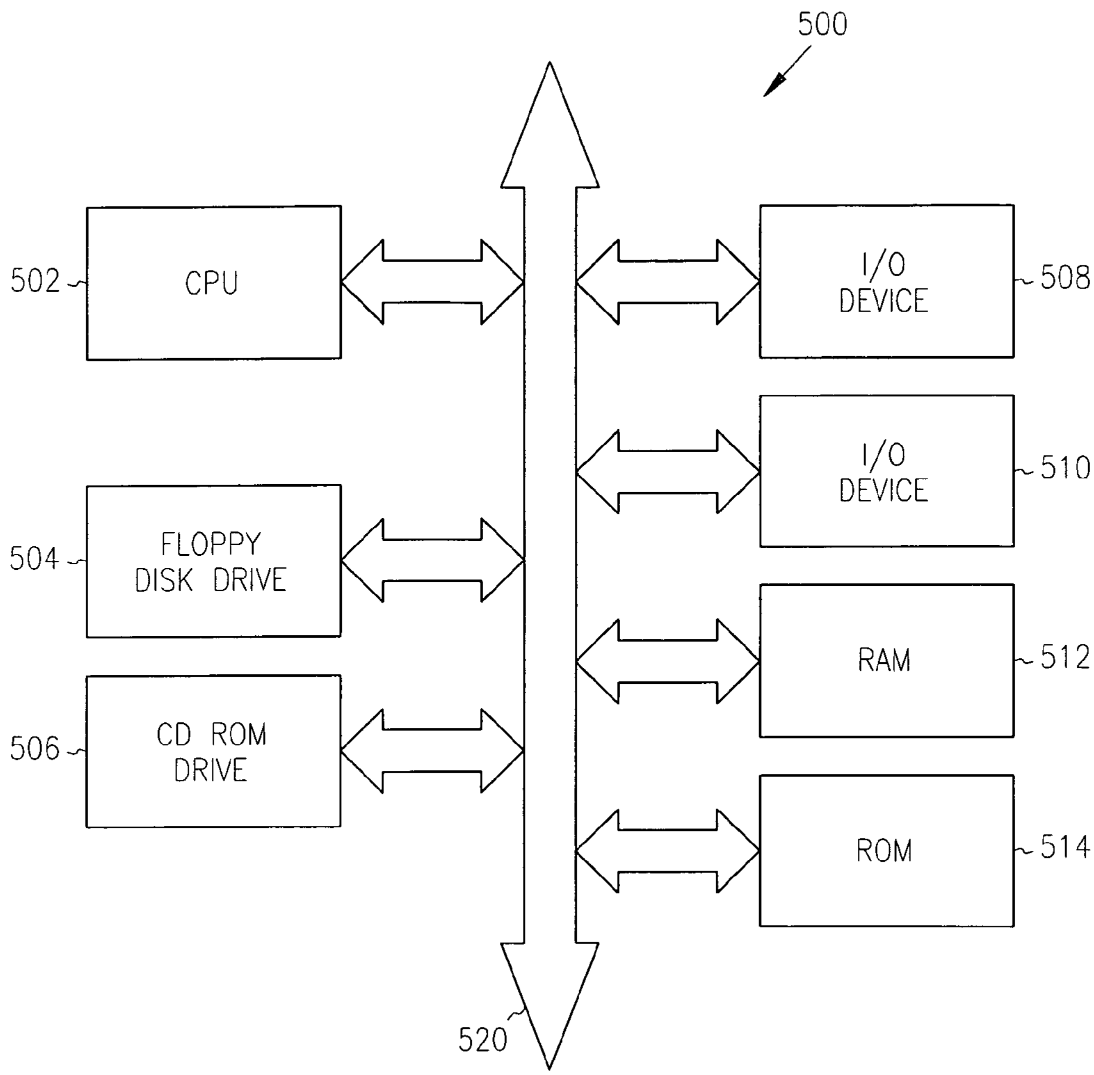
FIG. 5 is a block diagram illustrating an embodiment of an electronic system utilizing the memory cells of the present invention.

FIG. 5 is a block diagram of a processor-based system 500 utilizing a vertical merged MOS-bipolar-capacitor memory gain cell according to the various embodiments of the present invention. That is, the system 500 utilizes various embodiments of the memory cell illustrated in FIGS. 4A–4D. The processor-based system 500 may be a computer system, a process control system or any other system employing a processor and associated memory. The system 500 includes a central processing unit (CPU) 502, e.g., a microprocessor, that communicates with the RAM 512 and an I/O device 508 over a bus 520. It must be noted that the bus 520 may be a series of buses and bridges commonly used in a processor-based system, but for convenience purposes only, the bus 520 has been illustrated as a single bus. A second I/O device 510 is illustrated, but is not necessary to practice the invention. The processor-based system 500 also includes read-only memory (ROM) 514 and may include peripheral devices such as a floppy disk drive 504 and a compact disk (CD) ROM drive 506 that also communicates with the CPU 502 over the bus 520 as is well known in the art.

It will be appreciated by those skilled in the art that additional circuitry and control signals can be provided, and that the memory device 500 has been simplified to help focus on the invention.

It will be understood that the embodiment shown in FIG. 5 illustrates an embodiment for electronic system circuitry in which the novel memory cells of the present invention are used. The illustration of system 500, as shown in FIG. 5, is intended to provide a general understanding of one application for the structure and circuitry of the present invention, and is not intended to serve as a complete description of all the elements and features of an electronic system using the novel memory cell structures. Further, the invention is equally applicable to any size and type of system 500 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

METHODS OF FABRICATION

The inventor has previously disclosed a variety of vertical devices and applications employing transistors along the sides of rows or fins etched into bulk silicon or silicon on insulator wafers for devices in array type applications in memories. (See generally, U.S. Pat. Nos. 6,072,209; 6,150,687; 5,936,274 and 6,143,636; 5,973,356 and 6,238,976; 5,991,225 and 6,153,468; 6,124,729; 6,097,065). The present invention uses similar techniques to fabricate the single transistor vertical memory gain cell described herein. Each of the above referenced US Patents is incorporated in full herein by reference.

Figure 6A:
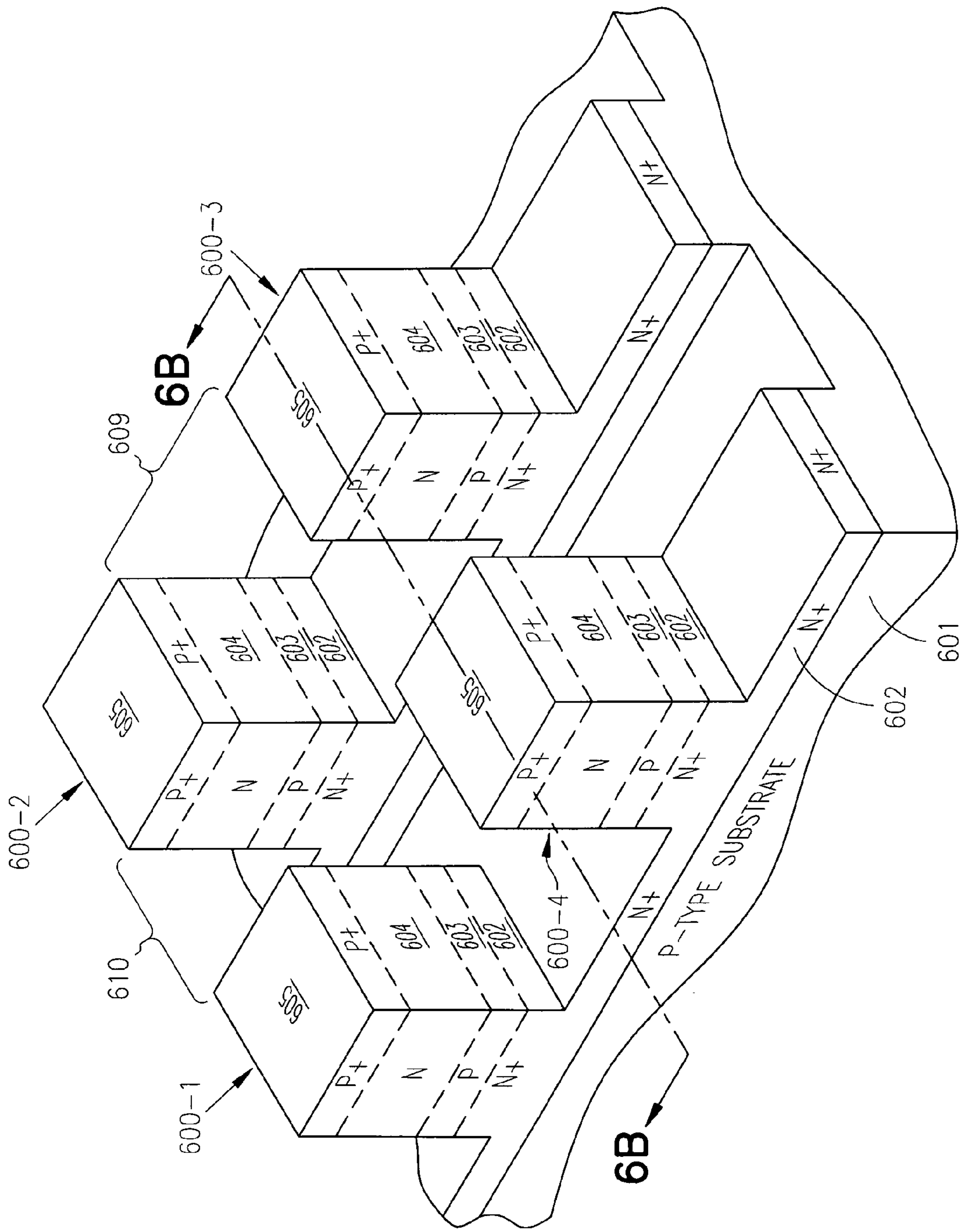
FIGS. 6A–6D illustrate one embodiment of a fabrication technique for memory cells according to the teachings of the present invention.

FIG. 6A outlines one embodiment of a fabrication technique for merged MOS-bipolar-capacitor memory gain cells where the emitter/sourceline 602 are separated and can be biased. In the embodiment of FIG. 6A, a p-type substrate 601 has been processed to include layers thereon of an n+ conductivity type 602, a p conductivity type 603, an n conductivity type 604, and a p+ conductivity type 605. In the embodiment of FIG. 6A, the fabrication continues with the wafer being oxidized and then a silicon nitride layer (not shown) is deposited to act as an etch mask for an anisotropic or directional silicon etch which will follow. This nitride mask and underlying oxide are patterned and trenches are etched as shown in both directions, leaving blocks of silicon, e.g. 600-1, 600-2, 600-3, and 600-4, having alternating layers of n and p type conductivity material. Any number of such blocks can be formed on the wafer. In the embodiment of FIG. 6A, two masking steps are used and one set of trenches, e.g. trench 610, is made deeper than the other, e.g. trench 609, in order to provide separation and isolation of the emitter/source lines 602.

Figure 6B:
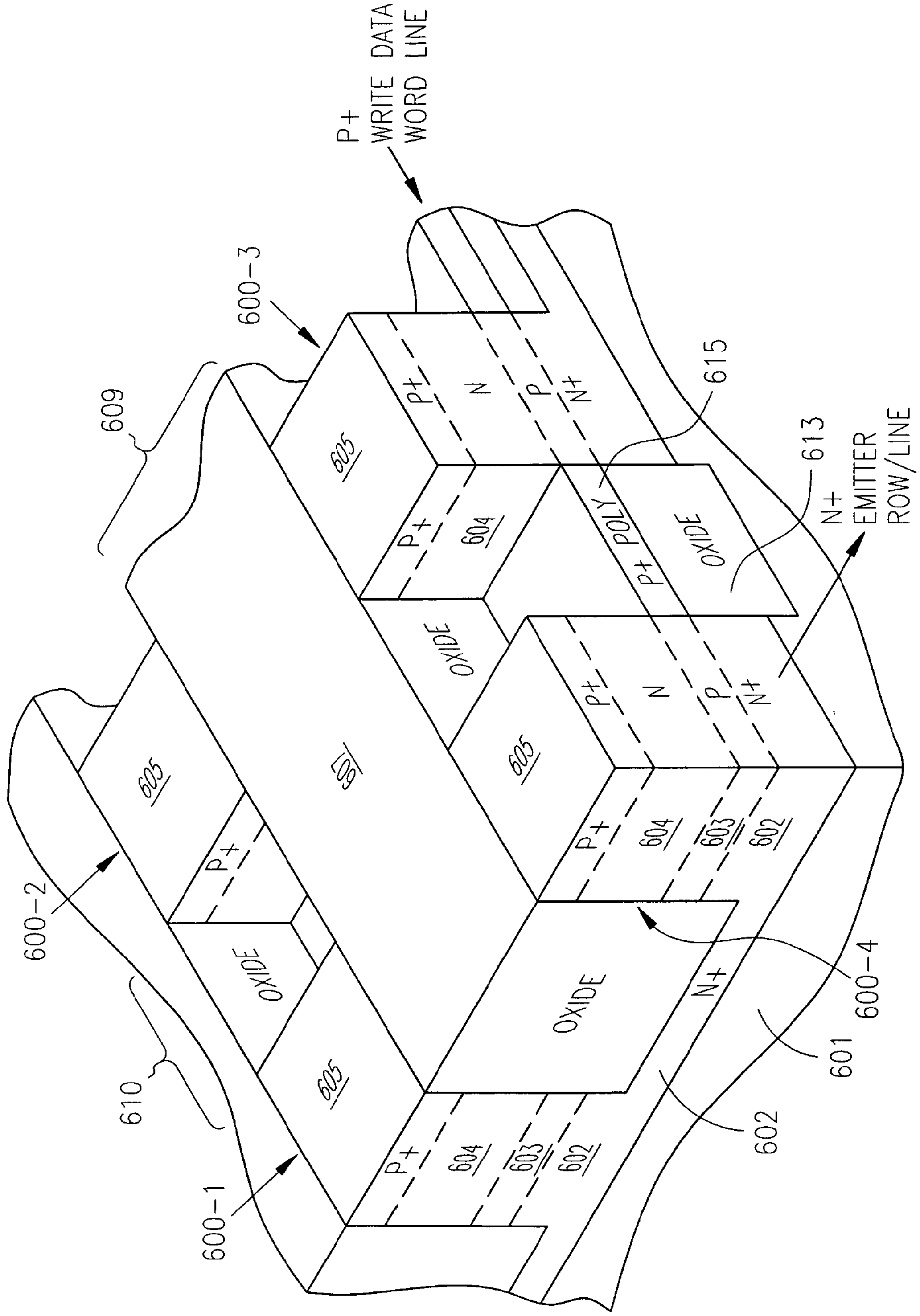

FIG. 6B illustrates a perspective view taken at cut line 6B—6B from FIG. 6A. In FIG. 6B, both trenches 609 and 610 are filled with oxide 607 and the whole structure is planarized such as by CMP. As shown in FIG. 6B, the oxide 615 in the write data word line blocks, trench 610, are recessed to near the bottom and just above the bottom of the p-type regions 603 in the pillars, 600-1, 600-2, 600-3, and 600-4. In the embodiment shown in FIG. 6B, p-type polysilicon 615 is deposited and planarized to be level with the tops of the pillars and then recessed to just below the top of the p-type regions 603 in the pillars, 600-1, 600-2, 600-3, and 600-4. This p-type poly 615 and the p-type regions 603 in the pillars 600-1, 600-2, 600-3, and 600-4 will form the write data word lines, shown as 432 in FIGS. 4B and 4C.

In FIG. 6C, oxide is again deposited and then planarized to the top of the pillars. Next, the trenches 609 for the read data word lines, shown as 421-1 in FIGS. 4B and 4C, and the capacitor plate lines, shown as 431 in FIG. 4C, are opened.

Figure 6C:
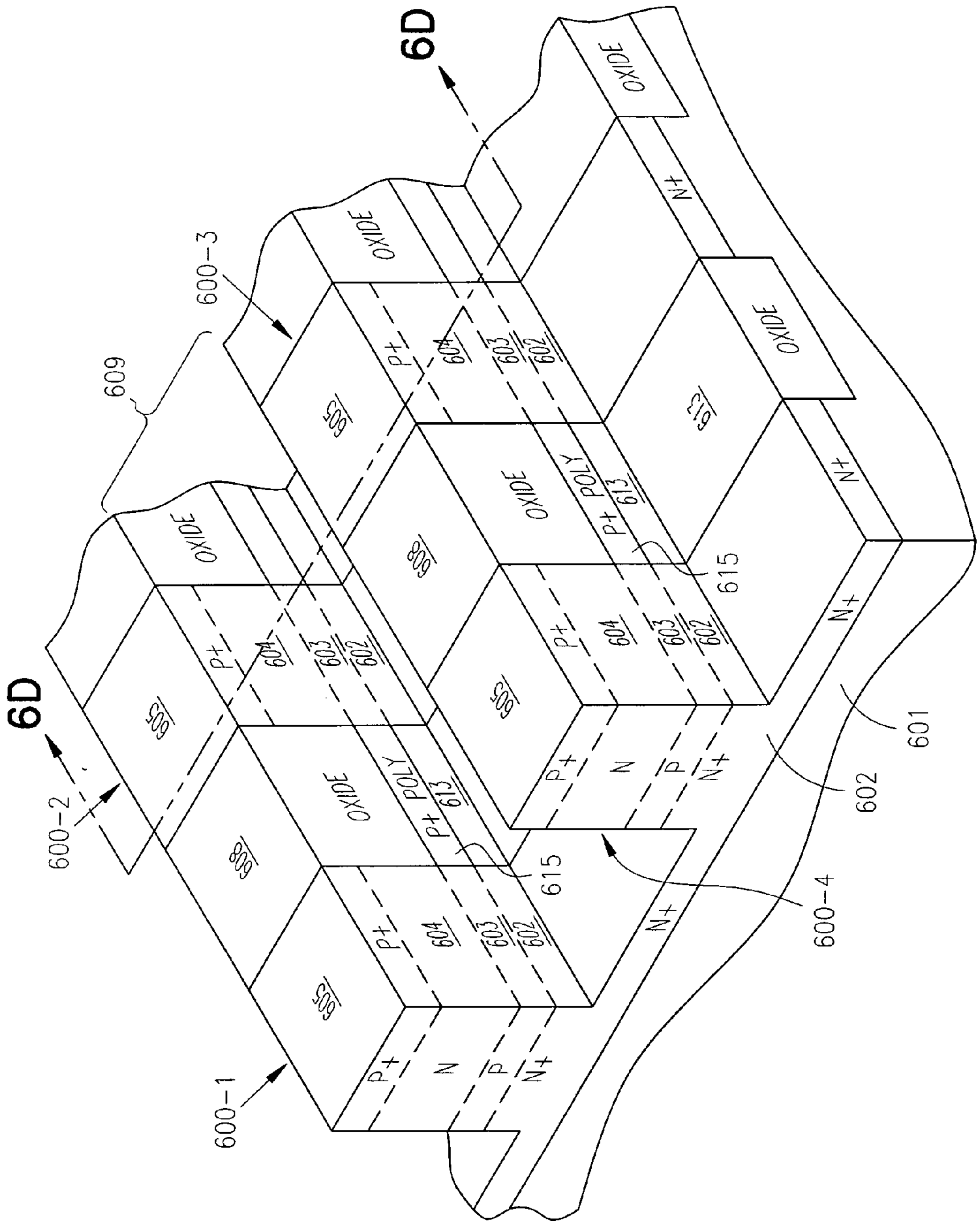
Figure 6D:
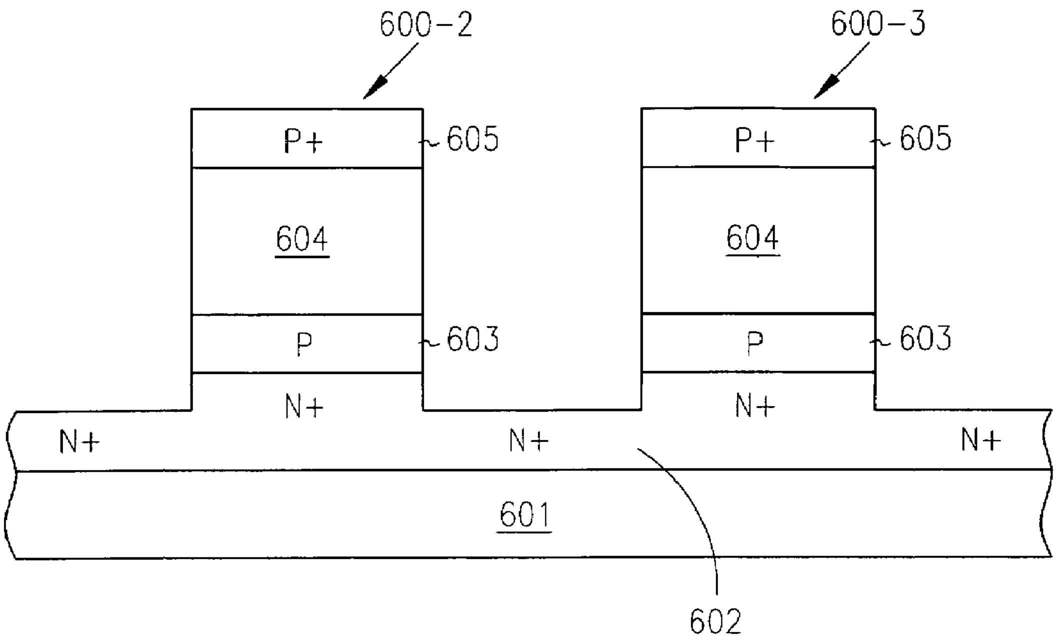

FIG. 6D illustrates a cross-sectional view taken along cut line 6D—6D in FIG. 6C. This remaining structure, as shown in the embodiment of FIG. 6D, can then be continued by conventional techniques including gate oxidation and deposition and anisotropic etch of polysilicon along the sidewalls to form body capacitor plate, e.g. 405-1 in FIGS. 4A–4C, and read data word lines, e.g. 421-1 in FIGS. 4B and 4C. The data or bit lines, 417 in FIGS. 4A–4C, on top can be realized using conventional metallurgy.

As one of ordinary skill in the art will appreciate upon reading this disclosure, the vertical merged MOS-bipolar-capacitor memory gain cell 401-1 of the present invention can provide a very high gain and amplification of the stored charge on the floating body 413-1 of the PMOS sense transistor 402-1. A small change in the threshold voltage caused by charge stored on the floating body 413-1 will result in a large difference in the number of holes conducted between the drain 415-1 and source 411-1 of the PMOS sense transistor 402-1 during the read data operation. This amplification allows the small storage capacitance of the sense amplifier floating body 413-1 to be used instead of a large stacked capacitor storage capacitance. The resulting cell 401-1 has a very high density with a cell area of $4F^2$, where F is the minimum feature size, and whose vertical extent is far less than the total height of a stacked capacitor or trench capacitor cell and access transistor.

While the description here has been given for a p-type substrate, an alternative embodiment would work equally well with n-type or silicon-on-insulator substrates. In that case, the sense transistor would be a PMOS transistor with an n-type floating body.

CONCLUSION

The cell can provide a very high gain and amplification of the stored charge on the floating body of the PMOS sense transistor. A small change in the threshold voltage caused by charge stored on the floating body will result in a large difference in the number of holes conducted between the drain and source of the PMOS sense transistor during the read data operation. This amplification allows the small storage capacitance of the sense amplifier floating body to be used instead of a large stacked capacitor storage capacitance. The resulting cell has a very high density with a cell area of $4F^2$, where F is the minimum feature size, and whose vertical extent is far less than the total height of a stacked capacitor or trench capacitor cell and access transistor.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for operating a memory cell, comprising:

providing a merged device cell, the merged device cell including:

a vertical MOS transistor having a source region, a drain region, and a floating body region therebetween;

a vertical bi-polar transistor having an emitter region, a base region and a collector region;

wherein the collector region for the vertical bi-polar transistor serves as the body region for the vertical MOS transistor; and modulating a threshold voltage and a conductivity of the vertical MOS transistor using the vertical bi-polar transistor.

2. The method of claim 1, wherein the method includes storing a first state on the floating body, wherein storing a first state on the floating body includes forward biasing the floating body.

3. The method of claim 2, wherein forward biasing the floating body includes:

applying a negative potential to the emitter region; and applying a positive potential to the base region to achieve a coincident address at one location.

4. The method of claim 1, wherein the method includes reading the cell using the vertical MOS transistor.

5. The method of claim 1, wherein the method includes storing a charge on the floating body.

6. The method of claim 1, wherein providing a merged device cell includes providing a vertical p-channel MOS transistor (PMOS) and providing a vertical N+-P-N bi-polar transistor.

7. The method of claim 1, wherein the method further includes providing a standby state, wherein the standby state includes:

applying a positive potential to a gate of the vertical MOS transistor; and applying a positive potential to a floating body back gate of the vertical MOS transistor to provide a reverse bias.

8. The method of claim 1, wherein the method further includes storing a second state on the floating body, wherein storing a second state on the floating body includes:

applying a positive potential to the drain region; and applying a negative potential to a gate of the vertical MOS transistor to forward bias a drain-floating body p-n junction.

9. A method for operating a memory cell, wherein the memory cell includes a vertical MOS transistor and a vertical bi-polar transistor, and wherein a collector of the vertical bi-polar transistor serves as a floating body of the vertical MOS transistor, the method comprising:

writing to the memory cell, including turning on the vertical bi-polar transistor to store charge on the floating body of the vertical MOS transistor; and reading from the memory cell, including applying a predetermined gate voltage to a gate of the vertical MOS transistor and sensing a potential on a drain of the vertical MOS transistor.

10. The method of claim 9, wherein:

the vertical MOS transistor includes a vertical p-channel MOS transistor (PMOS) and the vertical bi-polar transistor includes a vertical N+-P-N bi-polar transistor;

writing to the memory cell includes applying a logic high voltage to the base of the vertical N+-P-N bi-polar transistor to turn on the vertical N+-P-N bi-polar transistor; and reading from the memory cell includes applying a predetermined gate voltage to a gate of the vertical PMOS transistor.

11. The method of claim 10, wherein writing to the memory cell includes storing a first state on a floating body of the vertical PMOS transistor, wherein storing the first state on the floating body comprises:

applying a negative potential to an emitter region of the N+-P-N vertical bi-polar transistor; and applying a positive potential to a base region of the vertical N+-P-N bi-polar transistor to turn on the vertical N+-P-N bi-polar transistor and to store charge on the floating body.

12. The method of claim 11, wherein applying a negative potential to the emitter region includes applying a negative potential to a row line connected to the emitter region.

13. The method of claim 11, wherein applying a positive potential to the base region includes applying a positive potential to a write data word line connected to the base region.

14. The method of claim 11, wherein writing to the memory cell further includes storing a second state on a floating body of the vertical PMOS transistor, wherein storing a second state on the floating body comprises:

applying a positive potential to a drain region of the vertical PMOS transistor; and applying a negative potential to a gate of the vertical PMOS transistor to forward bias a drain-floating body p-n junction, to remove charge from the floating body region.

15. The method of claim 14, wherein applying a positive potential to the drain region includes applying a positive potential to a bit line connected to the drain region.

16. The method of claim 14, wherein applying a negative potential to the gate includes applying a negative potential to a read data word line connected to the gate.

17. The method of claim 10, wherein reading a value from a memory cell comprises:

applying a predetermined gate voltage to a gate of a vertical PMOS transistor, the vertical PMOS transistor having a source region, a drain region, and the floating body region therebetween;

sensing a potential of the drain region of the vertical PMOS transistor to achieve a coincident address at the memory cell location.

18. The method of claim 17, wherein applying a predetermined gate voltage to the gate includes applying a predetermined gate voltage to a read data word line connected to the gate.

19. The method of claim 17, wherein sensing a potential of the drain region includes sensing a potential of a bit line connected to the drain region.

20. A method for operating a memory cell, wherein the memory cell includes a vertical MOS transistor and a vertical bi-polar transistor, and wherein a collector of the vertical bi-polar transistor serves as a floating body of the vertical MOS transistor, the method comprising:

writing to the memory cell, including turning on the vertical bi-polar transistor to store charge on the floating body of the vertical MOS transistor;

reading from the memory cell, including applying a predetermined gate voltage to a gate of the vertical MOS transistor and sensing a potential on a drain of the vertical MOS transistor; and placing the memory cell into a standby state, including reverse biasing the floating body region.

21. The method of claim 20, wherein:

the vertical MOS transistor includes a vertical p-channel MOS transistor (PMOS) and the vertical bi-polar transistor includes a vertical N+-P-N bi-polar transistor;

writing to the memory cell includes applying a logic high voltage to the base of the vertical N+-P-N bi-polar transistor to turn on the vertical N+-P-N bi-polar transistor;

reading from the memory cell includes applying a predetermined gate voltage to a gate of the vertical PMOS transistor and sensing a potential on a drain of the vertical PMOS transistor; and placing the memory cell into a standby state includes applying a logic high voltage to a gate of the vertical PMOS transistor and applying a logic high voltage to a floating body back gate of the vertical PMOS transistor.

22. The method of claim 21, wherein placing the memory cell into a standby state includes:

applying a positive potential to a gate of a vertical PMOS transistor, the vertical PMOS transistor having a source region, a drain region, and the floating body region therebetween;

applying a positive potential to a floating body back gate of the vertical PMOS transistor to insure the floating body will not become forward biased, with respect to either the drain region or the source regions, during the standby state.

23. The method of claim 22, wherein applying a positive potential to the gate includes applying a positive potential to a read data word line connected to the gate.

24. The method of claim 22, wherein applying a positive potential to the floating body back gate includes applying a positive potential to a capacitor plate line connected to the floating body back gate.

25. A method for operating a memory cell, wherein the memory cell includes a vertical PMOS transistor and a vertical N+-P-N bi-polar transistor, and wherein a collector of the vertical N+-P-N bi-polar transistor serves as a floating body of the vertical PMOS transistor, the method comprising:

writing to the memory cell, including applying a negative potential to an emitter region of the N+-P-N Vertical bi-polar transistor and applying a positive potential to a base region of the vertical N+-P-N bi-polar transistor to turn on the vertical N+-P-N bi-polar transistor and to store charge on the floating body; and reading from the memory cell, including applying a predetermined gate voltage to a gate of a vertical PMOS transistor and sensing a potential of a drain region of the vertical PMOS transistor.

26. The method of claim 25, further comprising:

erasing the memory cell, including applying a positive potential to the drain region of the vertical PMOS transistor and applying a negative potential to the gate of the vertical PMOS transistor to forward bias a drain-floating body p-n junction, to remove charge from the floating body region.

27. The method of claim 25, further comprising:

placing the memory cell into a standby state, including applying a positive potential to the gate of the vertical PMOS transistor and applying a positive potential to a floating body back gate of the vertical PMOS transistor to insure the floating body will not become forward biased with respect to either the drain region or a source region of the vertical PMOS transistor.

* * * * *

UNITED STATES PATENT AND TRADEMARK OFFICE

CERTIFICATE OF CORRECTION

PATENT NO. : 6,940,761 B2
DATED : September 6, 2005
INVENTOR(S) : Forbes

It is certified that error appears in the above-identified patent and that said Letters Patent is hereby corrected as shown below:

Title page,
Item [56], References Cited, OTHER PUBLICATIONS,
"U.S. Appl. No. 10/230,292..." reference, delete "10/230,292" and insert -- 10/230,929 --;
"Shukuri, S." reference, after "*Technology*" delete "," and insert -- . --; and
"Wann, Hsing-Jen, et al." reference, after "Cell" insert -- on --.

Column 12,
Line 32, delete "Vertical" and insert -- vertical --.

Signed and Sealed this

Twenty-seventh Day of December, 2005

JON W. DUDAS
*Director of the United States Patent and Trademark Office*